United States Patent
Takayanagi (10) Patent No.: US 10,712,179 B2
(45) Date of Patent: Jul. 14, 2020

(54) NON-CONTACT OPERATION SENSING DEVICE FOR VEHICLE AND CAPACITANCE SENSOR

(71) Applicant: AISIN SEIKI KABUSHIKI KAISHA, Kariya-shi (JP)

(72) Inventor: Hitoshi Takayanagi, Kariaya (JP)

(73) Assignee: AISIN SEIKI KABUSHIKI KAISHA, Kariya-shi (JP)

( * ) Notice: Subject to any disclaimer, the term of this patent is extended or adjusted under 35 U.S.C. 154(b) by 120 days.

(21) Appl. No.: 15/988,762

(22) Filed: May 24, 2018

(65) Prior Publication Data

US 2018/0348015 A1    Dec. 6, 2018

(30) Foreign Application Priority Data

May 30, 2017 (JP) .................................. 2017-106515

(51) Int. Cl.
*G01D 5/24* (2006.01)
*B60R 19/48* (2006.01)
*H03K 17/955* (2006.01)
*H03K 17/96* (2006.01)

(52) U.S. Cl.
CPC ............... *G01D 5/24* (2013.01); *B60R 19/48* (2013.01); *H03K 17/955* (2013.01); *E05Y 2400/858* (2013.01); *H03K 2017/9602* (2013.01); *H03K 2217/96078* (2013.01)

(58) Field of Classification Search
CPC ............... H04L 41/0813; H04L 65/403; B60R 2300/8066; B60R 2300/8093; B60R 11/04; B60R 1/06; B60R 2001/1223; B60R 2300/8026; B60R 19/48; B60R 1/002; B60R 2001/1284; B60R 2011/0085; B60R 2300/802; H04W 4/023; H04W 8/18; H04W 8/24; E05Y 2400/858; G01D 21/02; G01D 5/24; G01B 7/00; H03K 17/955
See application file for complete search history.

(56) References Cited

U.S. PATENT DOCUMENTS

| | | | |
|---|---|---|---|
| 8,788,152 B2* | 7/2014 | Reimann | B60R 25/2036 296/146.4 |
| 9,051,769 B2* | 6/2015 | Washeleski | E05F 15/46 |
| 9,162,685 B2* | 10/2015 | Schindler | B60W 50/08 |
| 9,575,481 B2* | 2/2017 | Newman | G05B 19/00 |
| 9,587,417 B2* | 3/2017 | Van Gastel | E05B 81/78 |

(Continued)

FOREIGN PATENT DOCUMENTS

| | | |
|---|---|---|
| EP | 2 635 464 B1 | 8/2014 |
| JP | 2017-173121 | 9/2017 |
| WO | WO 2010/076332 A1 | 7/2010 |

*Primary Examiner* — Vinh P Nguyen
(74) *Attorney, Agent, or Firm* — Oblon, McClelland, Maier & Neustadt, L.L.P.

(57) ABSTRACT

A non-contact operation sensing device for a vehicle includes: a capacitance sensor having one electric wire that is attached to a portion near a location where a metal component is provided in a vehicle body, is folded to have portions arranged in parallel, and forms a wire loop electrode whose capacitance changes according to a non-contact operation with respect to the vehicle body, wherein an interval between the portions of the electric wire arranged in parallel in the wire loop electrode is narrower at a portion close to the metal component than at a portion distant from the metal component.

6 Claims, 6 Drawing Sheets

(56) References Cited

U.S. PATENT DOCUMENTS

| | | | |
|---|---|---|---|
| 10,563,447 B2* | 2/2020 | Gunreben | G01B 7/023 |
| 2008/0068145 A1* | 3/2008 | Weghaus | B60R 25/2054 |
| | | | 340/426.25 |
| 2011/0276234 A1 | 11/2011 | Van Gastel | |

* cited by examiner

NON-CONTACT OPERATION SENSING DEVICE FOR VEHICLE AND CAPACITANCE SENSOR

CROSS REFERENCE TO RELATED APPLICATIONS

This application is based on and claims priority under 35 U.S.C. § 119 to Japanese Patent Application 2017-106515, filed on May 30, 2017, the entire contents of which are incorporated herein by reference.

TECHNICAL FIELD

This disclosure relates to a capacitance sensor having a wire loop electrode, and a non-contact operation sensing device for a vehicle that senses a non-contact operation with respect to a vehicle body using such a capacitance sensor.

BACKGROUND DISCUSSION

As a non-contact operation sensing device for a vehicle mentioned above, one described in International Publication WO 2010/076332 (Reference 1) is known. The sensing device described in Reference 1 senses an in and out operation (kick motion) of a foot under the floor of a vehicle body by a capacitance sensor having a wire loop electrode provided at a lower portion of the vehicle body.

In the sensing device of Reference 1, except for a direction in which the non-contact operation which is a target to be sensed when viewed from the wire loop electrode is performed, a portion around the wire loop electrode is covered with the shield electrode, and the shield electrode is driven at the same potential as the wire loop electrode. In this way, the influence of the parasitic capacitance constantly generated between the metal component of the vehicle body such as a skeletal material and the wire loop electrode on the sensing accuracy is suppressed.

By the way, depending on the vehicle, a hitch for trailer connection is provided under the floor of the vehicle body. In a case where such a metal component such as a hitch is provided in the vicinity of the wire loop electrode, the sensing accuracy of the non-contact operation decreases due to the parasitic capacitance constantly generated between the wire loop electrode and the metal component.

Thus, a need exists for a non-contact operation sensing device for a vehicle and a capacitance sensor, which are not susceptible to the drawback mentioned above.

SUMMARY

A non-contact operation sensing device for a vehicle according to an aspect of this disclosure includes: a capacitance sensor having one electric wire that is attached to a portion near a location where a metal component is provided in a vehicle body, is folded to have portions arranged in parallel, and forms a wire loop electrode whose capacitance changes according to a non-contact operation with respect to the vehicle body. An interval between the portions of the electric wire arranged in parallel in the wire loop electrode is narrower at a portion close to the metal component than at a portion distant from the metal component.

A capacitance sensor according to another aspect of this disclosure includes: one electric wire that forms a wire loop electrode; and a holder having first and second wire-holding lanes that are each for holding the electric wire, are spaced apart from each other, and extend in parallel to each other, wherein when one of both ends of the holder in the extending direction of the wire-holding lane is called a drawing end and the other one thereof is called a folding-back end, the electric wire is held in the holder in such a manner that both ends of the electric wire are drawn from the first and second holding lanes, respectively, at the drawing end and are folded back at the folding-back end so as to shift from the first wire-holding lane to the second wire-holding lane, and the holder has a plurality of replacement portions that allow shift between the wire-holding lanes for holding the electric wire.

BRIEF DESCRIPTION OF THE DRAWINGS

The foregoing and additional features and characteristics of this disclosure will become more apparent from the following detailed description considered with the reference to the accompanying drawings, wherein.

DETAILED DESCRIPTION

Hereinafter, a first embodiment of a non-contact operation sensing device for a vehicle will be described in detail with reference to FIGS. 1 to 5.

Figure 1:
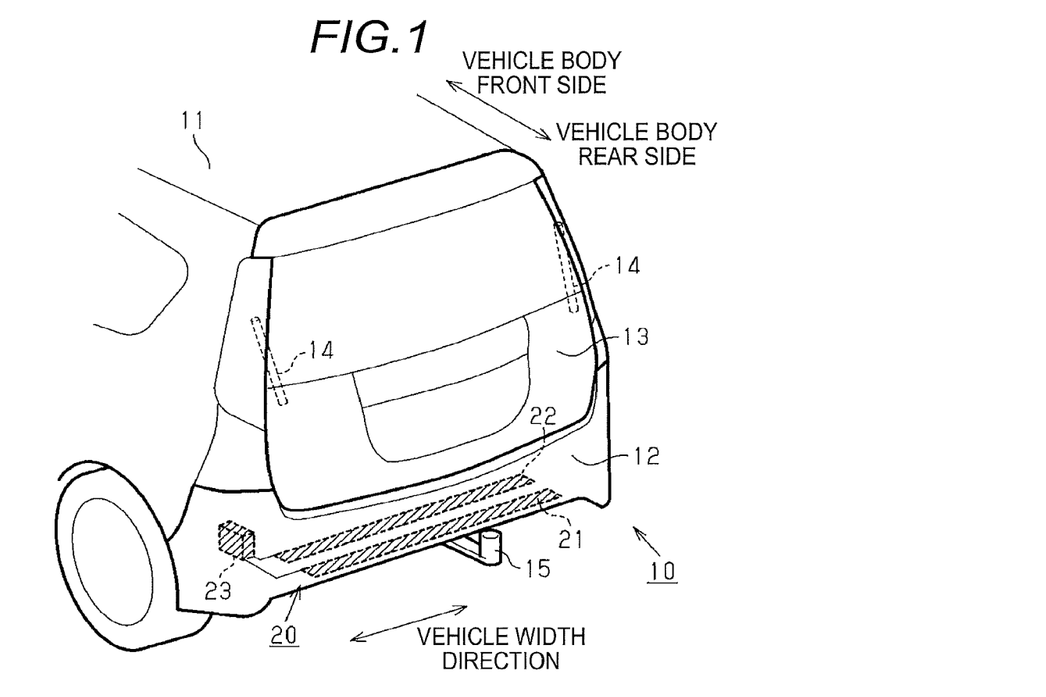
FIG. 1 is a perspective view illustrating a disposition of a capacitance sensor in a vehicle according to a first embodiment.

As illustrated in FIG. 1, in a vehicle 10 to which the present embodiment is applied, a hatchback type backdoor 13 is provided in a portion of an upper side of a vehicle body of the rear bumper 12 in a rear portion of a vehicle body 11. In addition, an actuator 14 which drives opening and closing of the backdoor 13 is provided in the vehicle body 11. Further, a hitch 15 for trailer connection, which is a metal component, is attached to a central portion of the rear portion of the vehicle body 11 in a vehicle width direction. The hitch 15 is provided so as to be fixed to a portion of the front side of the vehicle body of the rear bumper 12 in a bottom surface of the vehicle body 11 and protrude to the rear side of the vehicle body of the rear bumper 12 through a portion of the lower side of the rear bumper 12 under the floor of the vehicle body 11.

In addition, the vehicle 10 includes a capacitance sensor 20 for sensing in and out motions of a toe with respect to a space below the rear bumper 12 below the floor of the vehicle body 11. The capacitance sensor 20 includes two wire loop electrodes 21 and 22 provided inside the rear bumper 12 and extending in the vehicle width direction. These two wire loop electrodes 21 and 22 are provided in parallel in a front and rear direction of the vehicle body on a portion of the vehicle body lower side in the internal space of the rear bumper 12.

These two wire loop electrodes 21 and 22 are connected to a control unit 23 provided on the vehicle body 11, respectively. The control unit 23 senses the in and out operation of the toe from a change in capacitance of the wire loop electrodes 21 and 22. Then, the control unit 23 performs drive control of the actuator 14 so as to open and close the backdoor 13 according to the sensing thereof.

Figure 2:
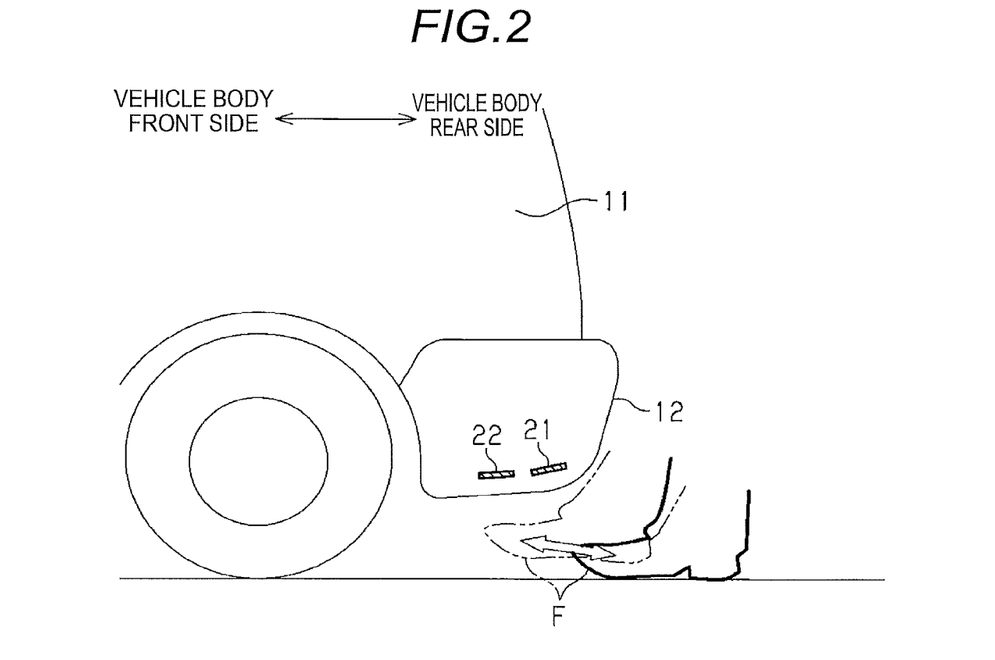
FIG. 2 is a diagram illustrating a sensing aspect of in and out motions of a toe by the capacitance sensor.

With reference to FIG. 2, a sensing aspect of the in and out operation of the toe by the capacitance sensor 20 will be described. On the floor of the vehicle body 11, the in and out operation performs so as to return the toe F to the position indicated by the solid line in FIG. 2 after inserting the toe F from a position of the rear side of the vehicle body of the rear bumper 12 indicated by the solid line in FIG. 2 to a position just below the rear bumper 12 indicated by the two-dot chain line in FIG. 2. At the time of this insertion, the toe F first reaches the position just below the wire loop electrode 21 on the rear side of the vehicle body, and then reaches the position just below the wire loop electrode 22 on the front side of the vehicle body. At the time of the subsequent returning, the toe F first is spaced apart from the position immediately below the wire loop electrode 22 on the front side of the vehicle body, and then spaces apart from the position just below the wire loop electrode 21 on the rear side of the vehicle body.

On the other hand, the capacitance of each of the wire loop electrodes 21 and 22 increases according to the approaching toe F which is a conductor and decreases according to the separation. Therefore, when the in and out operation of the toe F is performed, the capacitance of each of the wire loop electrodes 21 and 22 changes in a predetermined pattern. Therefore, the control unit 23 senses this operation by determining whether or not the in and out operation of the toe F is performed from the change pattern of the capacitance of both wire loop electrodes 21 and 22.

Figure 3:
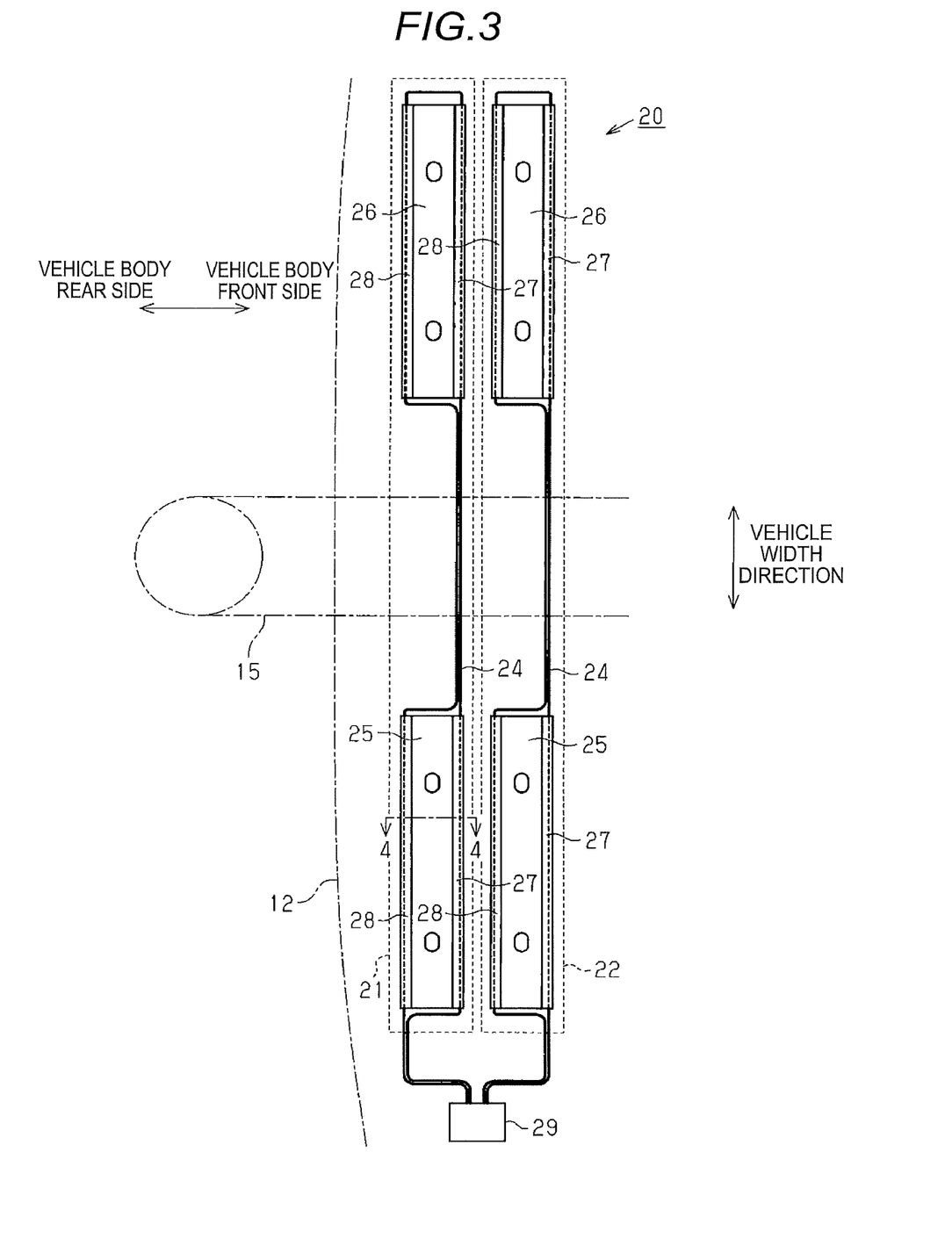
FIG. 3 is a plan view of the capacitance sensor.
Figure 4:
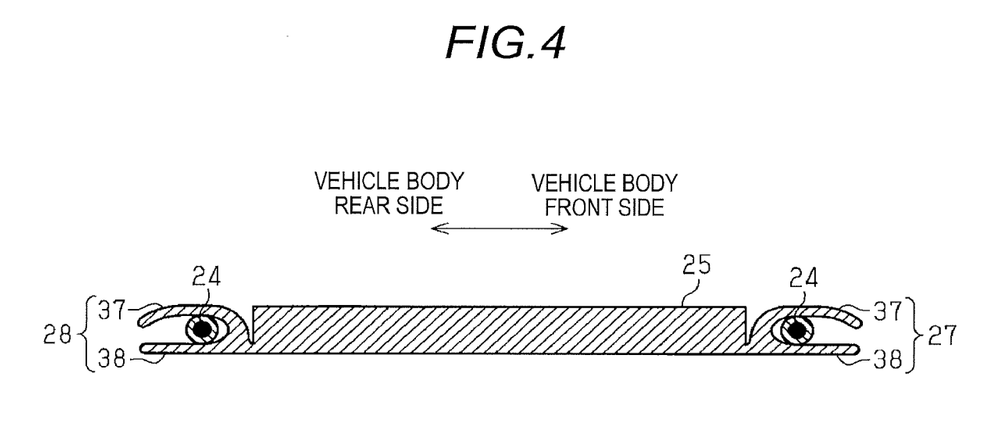
FIG. 4 is a sectional view of the capacitance sensor taken along line 4-4 of FIG. 3.

With reference to FIGS. 3 and 4, detailed configurations of the wire loop electrodes 21 and 22 of the capacitance sensor 20 will be described. As illustrated in FIG. 3, each of the wire loop electrodes 21 and 22 is configured with one insulated electric wire 24, and two holders 25 and 26 attached to the rear bumper 12 in a state of holding the electric wire 24.

The holders 25 and 26 are substantially rectangular resin plates extending in a direction which is the vehicle width direction in a state assembled to the vehicle body 11 and are attached to the inside of the rear bumper 12. In the rear bumper 12, both holders 25 and 26 are provided at intervals in the vehicle width direction with interposing the location of the hitch 15 therebetween when viewed from above the vehicle body. The holders 25 and 26 have the same shape.

The holders 25 and 26 are provided with two wire-holding lanes 27 and 28 and extending parallel to each other at intervals capable of holding the electric wires 24, respectively. In the following description, in each holder 25 and 26, the wire-holding lane on the side positioned on the front side of the vehicle body when assembled to the vehicle body 11 is referred to as a first lane 27, and the wire-holding lane on the side positioned on the rear side of the vehicle body is referred to as a second lane 28. In each holder 25 and 26, the first lane 27 and the second lane 28 are extended in a direction which is the vehicle width direction when assembled to the vehicle body 11.

FIG. 4 illustrates a sectional structure of the holder 25 taken along line 4-4 in FIG. 3. As illustrated in FIG. 4, the first lane 27 and the second lane 28 are formed so as to hold the electric wire 24 by catching it from above and below. In other words, the first lane 27 and the second lane 28 each have spaced apart upper and lower lips 37 and 38 at intervals which face each other. The interval between the upper and lower lips 37 and 38 when nothing is interposed in the interval is set to be slightly smaller than the diameter of the electric wire 24 at a portion on the inner side of the holder 25 in the width direction, and in a portion of the outer side of the holder 25 in the width direction, the interval therebetween is set to be slightly narrower than the diameter of the portion of the outer side of the holder 25 in the width direction at the portion on the inner side of the holder 25 in the width direction. Accordingly, the first lane 27 and the second lane 28 can interpose and hold the electric wire 24 between the upper and lower lips 37 and 38. Each of the first lane 27 and the second lane 28 has a width such that two of the electric wires 24 can be held in parallel.

On the other hand, as illustrated in FIG. 3, the electric wire 24 is connected to a connector 29 for connection to the control unit 23. Then, the electric wire 24 is provided so as to be folded back after passing through the first lane 27 of the holder 25 and the first lane 27 of the holder 26 from the connector 29, to pass through the second lane 28 of the holder 26 and the second lane 28 of the holder 25, and to return to the connector 29. Accordingly, the wire loop electrodes 21 and 22 extending in the vehicle width direction are formed by folding and holding the electric wires 24 in the holders 25 and 26 in such a manner that the folded back portions are arranged in parallel.

On the other hand, in a portion between the holders 25 and 26, the folded front and rear portions of the electric wire 24 are bundled. Therefore, in each of the wire loop electrodes 21 and 22, the interval between portions of the electric wire 24 arranged in parallel is narrower at the center portion in the vehicle width direction close to the hitch 15 than at the portions on both sides which are spaced apart from the hitch 15 in the vehicle width direction.

Advantages

Subsequently, advantages of the non-contact operation sensing device for a vehicle according to the present embodiment configured as described above will be described.

As described above, in the vehicle 10 to which the sensing device according to the present embodiment is applied, on a portion of the lower side of the center portion of the rear bumper 12 in the vehicle width direction where the wire loop electrodes 21 and 22 of the capacitance sensor 20 are provided, the hitch 15 which is a metal component is provided. Thus, the parasitic capacitance due to the hitch 15 is generated in the wire loop electrodes 21 and 22. In addition, when a hook of the trailer is connected to the hitch 15, parasitic capacity is generated also due to the hook.

If such parasitic capacitance is large, the detection range of the capacitance of each of the wire loop electrodes 21 and 22 in the control unit 23 has to be widened correspondingly, the resolution of the detection value of the capacitance is lowered, and thus the sensing accuracy is lowered. In addition, since the hook of the trailer is movably connected to the hitch 15, the magnitude of the parasitic capacitance changes as the hook moves relative to the hitch 15. Therefore, there is also a concern that such change in parasitic capacitance may be falsely sensed as a change in capacitance caused by the in and out operation of the toe F.

Against this, in the embodiment described above, the capacitance sensor 20 is used, which have the wire loop electrodes 21 and 22 that are formed by folding the electric wires 24 in such a manner that they have portions arranged in parallel. The sensitivity of the wire loop electrodes 21 and 22 in the capacitance sensor 20, that is, the ease of generation of change in capacitance with respect to the approaching conductor changes depending on the interval between portions of the electric wire 24 arranged in parallel in each of the wire loop electrodes 21 and 22.

Figure 5:
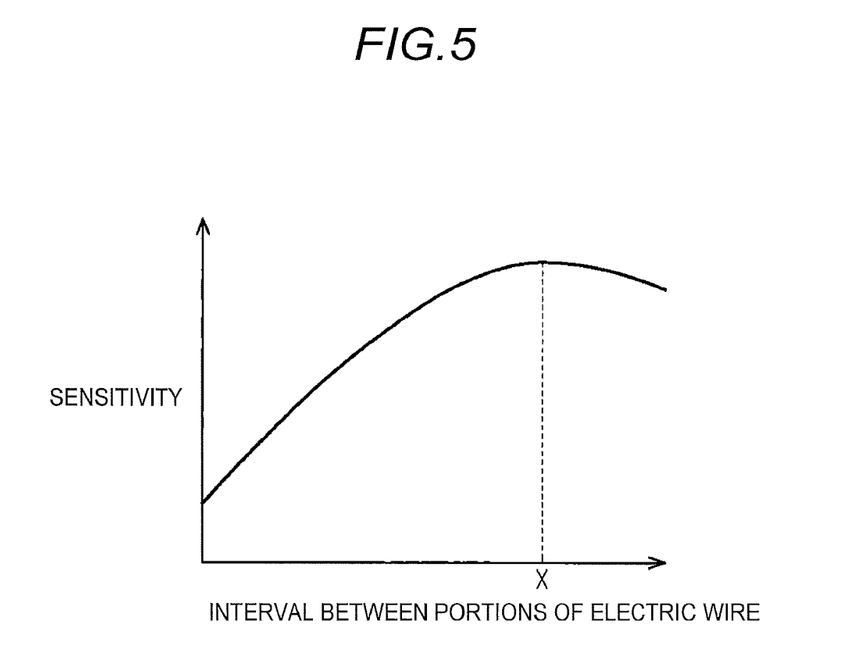
FIG. 5 is a graph illustrating a relationship between the sensitivity to the approaching conductor and the interval between portions of an electric wire of a wire loop electrode.

FIG. 5 illustrates a relationship between the interval between the portions of the electric wire 24 and the sensitivity of each of the wire loop electrodes 21 and 22. As illustrated in FIG. 5, the sensitivity of the wire loop electrodes 21 and 22 to the approaching conductor is maximized when the interval between the portions of the electric wire 24 is a fixed value X. Increasing the interval between the portions of the electric wire 24 to larger than the value X at which the sensitivity becomes maximum leads to an unnecessary increase in the area of the wire loop electrodes 21 and 22 and is not rational. Therefore, the interval between the portions of the electric wire 24 in each of the wire loop electrodes 21 and 22 is set within the range of the value X or less, at which the sensitivity becomes maximum.

According to this, in the present embodiment, as described above, at the center portion in the vehicle width direction positioned close to the hitch 15 when attached to the vehicle 10, the wire loop electrodes 21 and 22 are each formed so that the interval between the portions of the electric wire 24 becomes narrower than at portions of both sides spaced apart from the hitch 15 in the vehicle width direction. In such wire loop electrodes 21 and 22, the sensitivity of the portion positioned in the vicinity of the hitch 15 locally decreases, and the parasitic capacitance generated by the hitch 15 decreases.

According to the non-contact operation sensing device for a vehicle according to the present embodiment described above, the following effects can be obtained.

(1) In the present embodiment, the interval between the portions of the electric wire 24 in each of the wire loop electrodes 21 and 22 is made narrower at a portion close to the hitch 15 than at a portion distant from the hitch 15. Therefore, it is possible to reduce the parasitic capacitance generated between the hitch 15 and the wire loop electrodes and to suppress a decrease in the sensing accuracy due to the parasitic capacitance.

(2) By installing a shield electrode between the hitch 15 and the wire loop electrodes 21 and 22 and also driving the wire loop electrodes 21 and 22 and the shield electrode at the same potential, a decrease in the sensing accuracy due to the parasitic capacitance of the hitch 15 can be suppressed. However, in such a case, it is necessary to add a shield electrode and a driving circuit, and the manufacturing cost increases accordingly. On the other hand, in the present embodiment, since a decrease in the sensing accuracy due to the parasitic capacitance of the hitch 15 is suppressed by merely forming a portion where the interval between the portions of the electric wire 24 is partially narrow in each of the wire loop electrodes 21 and 22, it is possible to suppress an increase in manufacturing cost for suppressing a decrease in sensing accuracy due to the hitch 15.

(3) The hitch 15 that generates the parasitic capacitance is provided in a portion between a space which is a target to be sensed and in which the in and out operation of the toe F is performed and the wire loop electrodes 21 and 22. In a case where such a decrease in the sensing accuracy due to the parasitic capacitance of the hitch 15 is suppressed by the shield electrode as described above, the shield electrode is provided at a position closer to the target to be sensed than the wire loop electrodes 21 and 22, and a portion of the installation space of the shield electrode and the locations of the wire loop electrodes 21 and 22 are spaced apart from the target to be sensed. On the other hand, the change in the capacitance of the wire loop electrodes 21 and 22 due to the conductor decreases as the distance from the conductor increases. Therefore, in this case, even if a decrease in the sensing accuracy due to the parasitic capacitance of the hitch 15 is suppressed, the sensing accuracy causes a decrease due to the increase in the distance between the target to be sensed and the wire loop electrodes 21 and 22. In this regard, according to the present embodiment, it is possible to suppress a decrease in the sensing accuracy due to the parasitic capacitance of the hitch 15 without causing a decrease in sensing accuracy and causing an increase in the distance between the target to be sensed and the wire loop electrodes 21 and 22, and it is easy to secure sensing accuracy.

Task of Second Embodiment

The hitch for trailer connection is set as an optional equipment in many kinds of vehicles, and even in the same type of vehicles, there are cases where vehicles on which the hitch is provided and vehicles on which the hitch is not provided are mixed. In a case where a metal component such as a hitch is present between the space where the non-contact operation which is a target to be sensed is performed and the wire loop electrode, because of the parasitic capacitance constantly generated between the wire loop electrode and the metal component, the sensing accuracy of the non-contact operation decreases. Accordingly, dedicated capacitance sensors are required for vehicles on which the hitch is provided and vehicles on which the hitch is not provided, respectively. However, due to the difference in an optional equipment, if each dedicated capacitance sensor is prepared, the type of capacitance sensor that needs to be produced increases correspondingly, and thus there is a concern that causes a decrease in productivity.

The present embodiment has been made in view of such circumstances, and a problem to be solved is to make common components of a plurality of kinds of capacitance sensors which are applied to vehicles having different installing situations of metal components, which leads to a decrease in sensing accuracy.

Configuration of Second Embodiment

A configuration of a second embodiment of a non-contact operation sensing device for a vehicle and a capacitance sensor for solving the above problem will be described with reference to FIGS. 6 to 8. In this embodiment, the same reference numerals are given to the configurations common to those of the above embodiment, and a detailed description thereof will be omitted.

As in the first embodiment, the non-contact operation sensing device for a vehicle according to the present embodiment is applied to the vehicle 10 illustrated in FIG. 1, and the capacitance sensor 20 of the sensing device includes two wire loop electrodes 21 and 22 which are provided inside the rear bumper 12. In the vehicle 10 to which the present embodiment is applied, the hitch 15 is an optional equipment, and depending on individuals of the vehicle 10, there are a vehicle on which a hitch 15 is provided and a vehicle on which a hitch 15 is not provided. In addition, the non-contact operation sensing device for a vehicle according to the present embodiment also senses the in and out operation of the toe F as illustrated in FIG. 2. However, in the sensing device according to the present embodiment, the configuration of the holder for holding the electric wire 24 in each of the wire loop electrodes 21 and 22 of the capacitance sensor 20 is different from that in the first embodiment.

Figure 6:
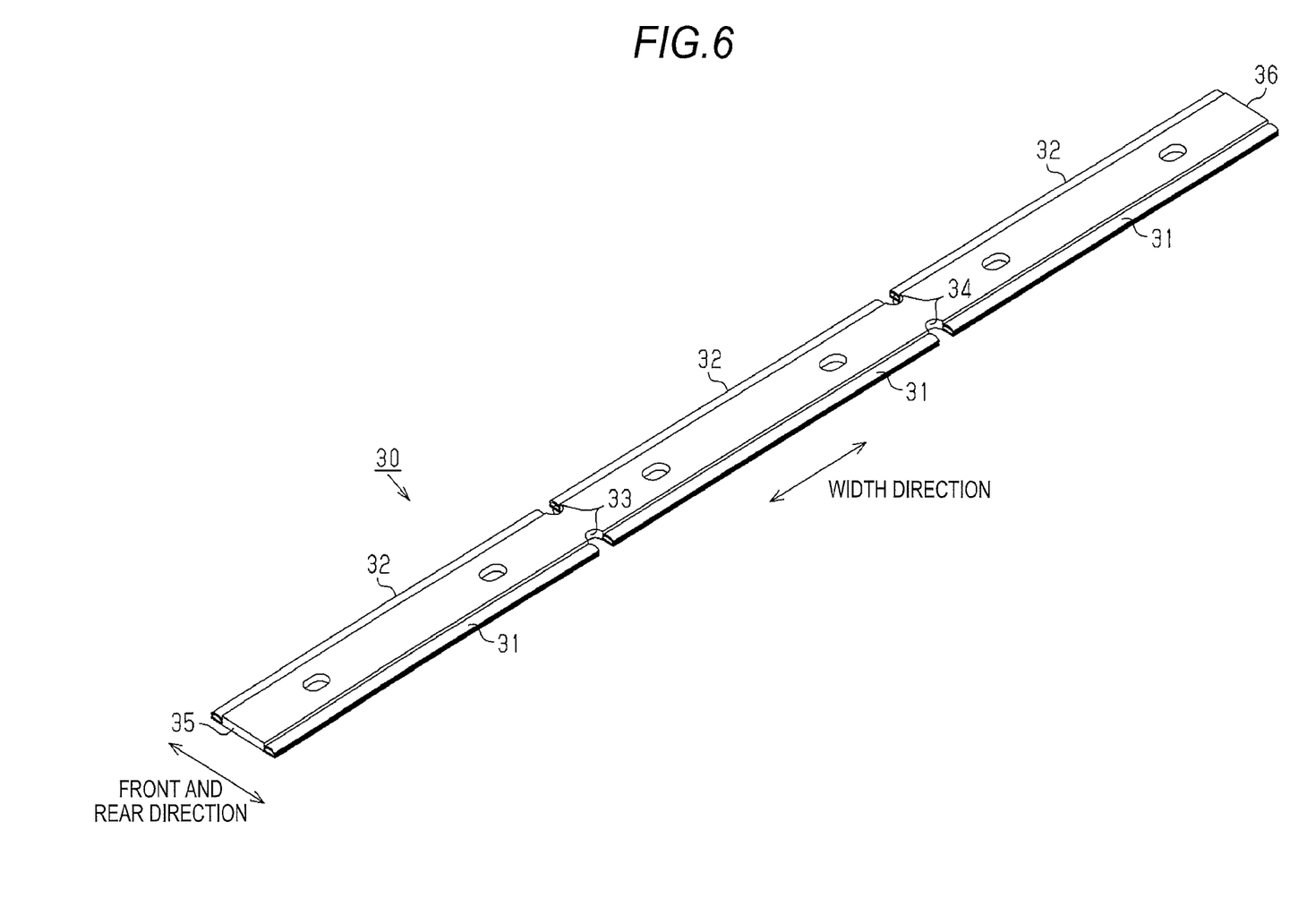
FIG. 6 is a perspective view of a holder which is a constituent component of a capacitance sensor of a second embodiment.

FIG. 6 illustrates a perspective structure of the holder 30 provided in the capacitance sensor 20 according to the present embodiment. One holder 30 is provided for each of the two wire loop electrodes 21 and 22 of the capacitance sensor 20. In the following description, the directions which are the vehicle width direction and the vehicle body front and rear direction when assembled to the vehicle body 11 in the holder 30 are referred to as the width direction and the front and rear direction of the holder 30, respectively.

As illustrated in FIG. 6, the holder 30 is a substantially rectangular plate member extending in the width direction. Wire-holding lanes 31 and 32 extending in the width direction are provided on both side portions of the front and rear sides of the holder 30 in parallel to each other at intervals, respectively. Like the holders 25 and 26 in the first embodiment illustrated in FIG. 4, these wire-holding lanes 31 and 32 are formed in such a shape as to be capable of holding and by interposing the electric wires 24 therebetween from above and below. In the following description, among the two wire-holding lanes provided in the holder 30, the wire-holding lane on the side positioned behind the vehicle body when assembled in the vehicle is referred to as a first lane 31, and the wire-holding lane on a side positioned on the front side of the vehicle body is referred to as a second lane 32. In addition, in the following description, one of both ends of the holder 30 in the extending direction (width direction) of the first lane 31 and the second lane 32 is referred to as a drawing end 35, and the other is referred to as a folding-back end 36.

In the holder 30, there are provided portions 33 and 34 in which cutouts are formed from two sides in the front and rear direction toward the inside in the width direction of the holder 30. In a portion where these cutouts are formed, the first lane 31 and the second lane 32 are discontinued. Therefore, in such a portion where the cutout is formed, it is possible to replace the wire-holding lane holding the electric wire 24 between the first lane 31 and the second lane 32. In other words, the portion where the cutout is formed in the holder 30 becomes the replacement portions 33 and 34 which can replace the wire-holding lane holding the electric wire 24 between the first lane 31 and the second lane 32.

Figure 7:
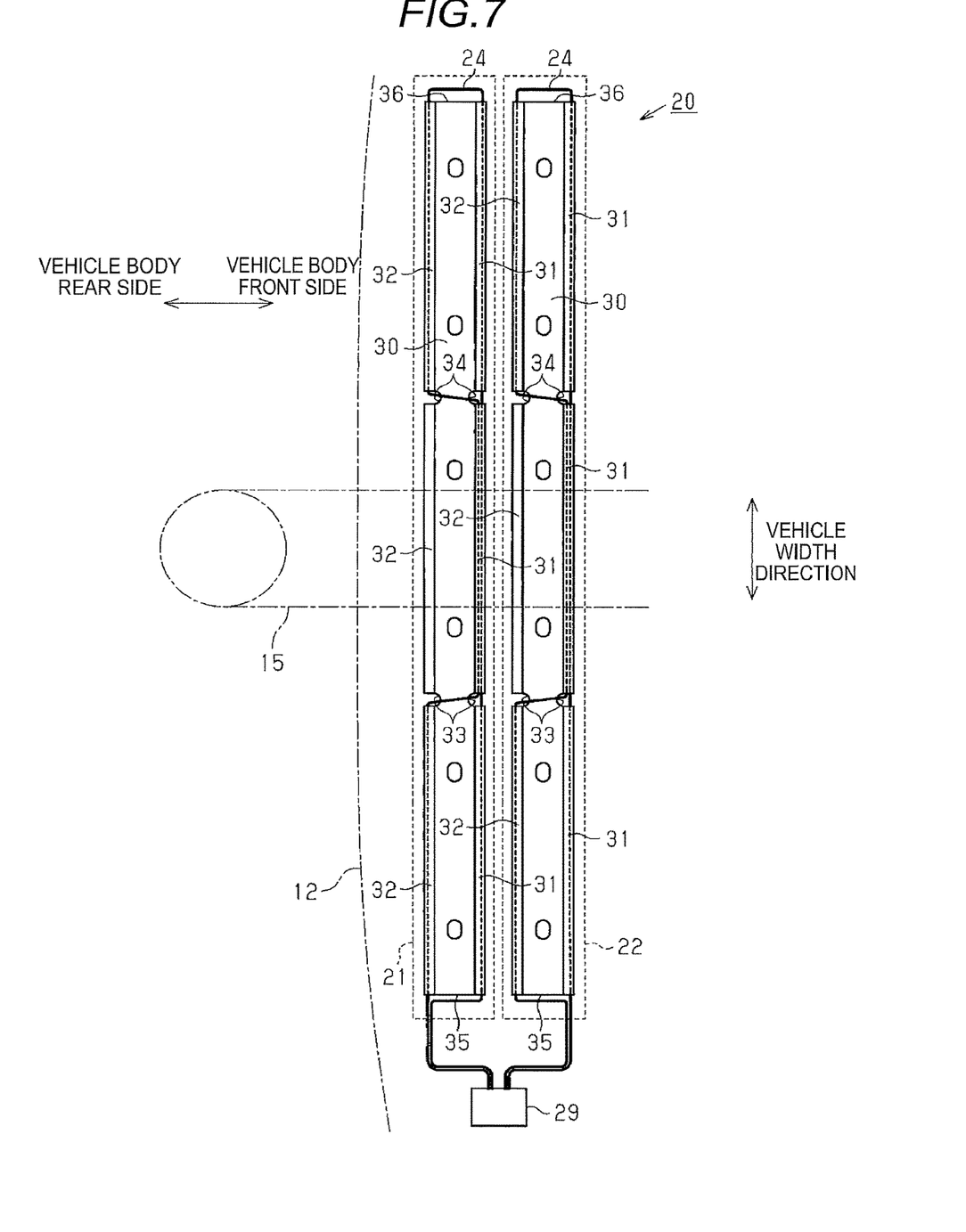
FIG. 7 is a plan view of the same capacitance sensor in a case of being configured for a vehicle on which a hatch is provided.

As illustrated in FIG. 7, in the holder 30, when the holder 30 in a state of being attached to the rear bumper 12 is viewed from the upper side of the vehicle body, the two replacement portions 33 and 34 of the holder 30 interpose the installation location of the hitch 15 therebetween and are provided at intervals in the vehicle width direction. Then, by holding the electric wire 24 in the holder 30 in the following aspect, wire loop electrode 21 and 22 each is formed.

In other words, in the holder 30, the electric wire 24 is drawn out from the first lane 31 and the second lane 32 at both ends of the electric wire 24 at the drawing end 35, and is held in a state of being folded back so as to be moved from the first lane 31 to the second lane 32 at the folding-back end 36. Both ends of the electric wire 24 drawn out from the drawing end 35 are connected to a connector 29 for connection to the control unit 23.

Here, in the electric wire 24, a section from the position of the drawing end 35 in the first lane 31 to a folded-back portion in the folding-back end 36 is defined as an outward section of the electric wire 24, and a section from the folded-back portion to the position of the drawing end 35 in the first lane 31 is defined as a returning section of the electric wire 24. The electric wire 24 in the outbound section is held in the first lane 31 from the drawing end 35 to the folding-back end 36. On the other hand, in the electric wire 24 in the returning section, a portion from the drawing end 35 to the replacement portion 33 and the other portion from the replacement portion 34 to the folding-back end 36 are held in the second lane 32, and a portion between the two replacement portions 33 and 34 is held in the first lane 31, respectively. In other words, in the holder 30, in a portion between the two replacement sections 33 and 34, the electric wire 24 in the outward section and the returning section is held in the same wire-holding lane (the first lane 31) and in the other portion, the electric wires 24 in the outward and returning sections are held in a state of dividing into the first lane 31 and the second lane 32. Therefore, in each of the wire loop electrodes 21 and 22, the interval between the outward section and the returning section of the electric wire 24 arranged in parallel is narrower at the center portion close to each hitch 15 in the vehicle width direction than at the portions of both sides spaced apart from the hitch 15 in the vehicle width direction.

As illustrated in FIG. 5, the sensitivity of the wire loop electrodes 21 and 22 to the approaching conductor is maximum when the interval between the outbound section and the returning section of the electric wire 24 is a certain value X, and as the interval becomes narrower from the value X thereof, the sensitivity thereof decreases. According to this, in the present embodiment, as described above, the wire loop electrodes 21 and 22 are formed so that the interval between the portions of the electric wire 24 is narrower at the center portion close to the hitch 15 in the vehicle width direction when being attached to the vehicle 10 than at portions of both sides spaced apart from the hitch 15 in the vehicle width direction. In such wire loop electrodes 21 and 22, the sensitivity of the portion positioned in the vicinity of the hitch 15 locally decreases, and the parasitic capacitance caused by the hitch 15 decreases. Therefore, a decrease in the sensing accuracy due to the parasitic capacitance of the hitch 15 can be suppressed.

The holder 30 can be directly applied to a capacitance sensor for a vehicle in which the hitch 15 is not provided by changing the manner of holding the electric wire 24.

Figure 8:
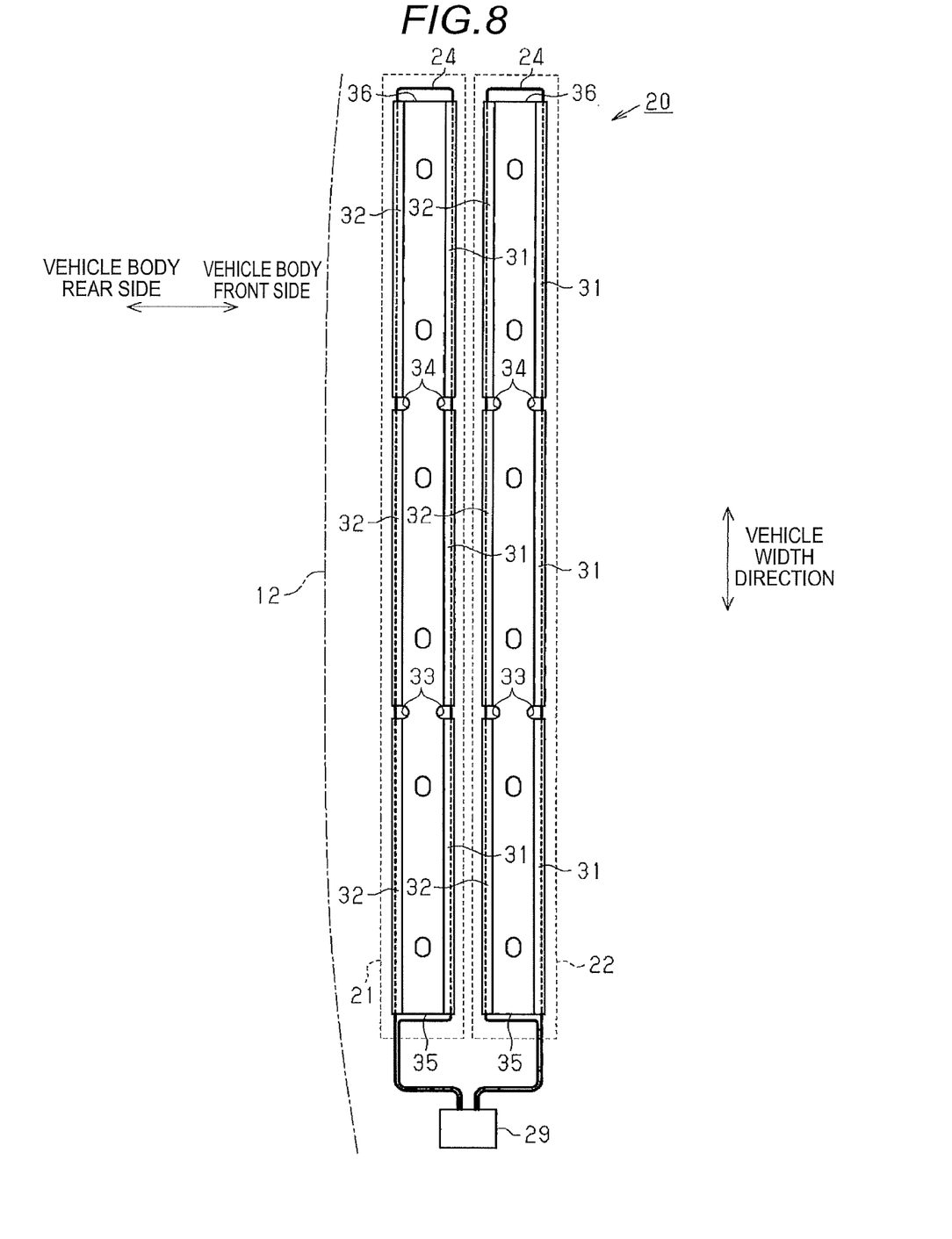
FIG. 8 is a plan view of the same capacitance sensor in a case of being configured for a vehicle on which the hatch is not provided.

As illustrated in FIG. 8, in this case, the electric wire 24 is assembled to the holder 30 so that the outward section passes through only the first lane 31, and the returning section passes through only the second lane 32 without the wire-holding lane being switched at a portion other than the folding-back end 36. In such a case, the interval between the outward section and the returning section of the electric wire 24 arranged in parallel is constant in the entire of each of wire loop electrodes 21 and 22. Therefore, in such a case, the entire wire loop electrodes 21 and 22 have high sensitivity, so that the in and out operation of the toe F can be sensed with high precision in the entire installation location of both wire loop electrodes 21 and 22 in the vehicle 10.

In the present embodiment configured as described above, it is possible to manufacture the capacitance sensors for the vehicle on which the hitch 15 is provided, and the vehicle on which the hitch 15 is not provided by using the common components, respectively. Therefore, it is possible to make common components of plural types of capacitance sensors applied to vehicles with different installing situations of metal components (hitch 15) which leads to a decrease in sensing accuracy.

The embodiment described above can also be implemented with the following modifications.

In the second embodiment, although the two replacement portions 33 and 34 are provided in the holder 30, three or more similar replacement portions may be provided. In such a case, by changing the manner of assembling the electric wires 24 to the holder 30, it is possible to form plural types of wire loop electrodes with different positions and lengths of the portion where the interval between the portions of the electric wire 24 is locally narrowed. Therefore, more kinds of capacitance sensors with further common components can be manufactured.

In the embodiments described above, although a case where this disclosure is applied to a vehicle in which the hitch 15 for trailer connection is provided as the metal component is described, also in a case where another metal component such as a muffler or the like is provided in the vicinity of the wire loop electrode, the sensing accuracy may be degraded due to parasitic capacitance similar to a case of the hitch 15. In such a case, likewise, the wire loop electrodes 21 and 22 may be configured to make the interval between the portions of the electric wire 24 narrower at a portion close to the metal component than at a portion distant from the metal component, so that the decrease in the sensing accuracy due to the parasitic capacitance of the metal component is suppressed.

Although the non-contact operation sensing device for a vehicle according to the embodiment described above is configured to sense the in and out operation of the toe F, the sensing device may be configured to sense a non-contact operation with respect to the vehicle body other than the in and out operation of the toe F, by changing the installation location and the installation number of wire loop electrodes in the vehicle.

A non-contact operation sensing device for a vehicle according to an aspect of this disclosure includes: a capacitance sensor having one electric wire that is attached to a portion near a location where a metal component is provided in a vehicle body, is folded to have portions arranged in parallel, and forms a wire loop electrode whose capacitance changes according to a non-contact operation with respect to the vehicle body. An interval between the portions of the electric wire arranged in parallel in the wire loop electrode is narrower at a portion close to the metal component than at a portion distant from the metal component.

In the capacitance sensor having the wire loop electrode configured as described above, as a conductor such as a hand or a foot of the human body approaches the wire loop electrode, capacitance generated between the adjacent conductor and the wire loop electrode changes. In the non-contact operation sensing device for a vehicle including such a capacitance sensor, it is possible to sense a non-contact operation with respect to the vehicle body from such a change in the capacitance of the wire loop electrode.

On the other hand, the capacitance change sensitivity of the capacitance sensor to an approaching conductor becomes maximum when the interval between the portions of the electric wire portions of the wire loop electrode reaches a certain distance, and as the interval between the portions of the electric wire becomes narrow from such a distance showing the maximum sensitivity, the sensitivity thereof decreases. Therefore, by narrowing the interval between the portions of the electric wire partially, a portion where the sensitivity is locally low is formed in the wire loop electrode. Therefore, if the wire loop electrode is formed so that the interval between the portions of the electric wire becomes narrower at a portion close to the metal component than at a portion distant from the metal component, the parasitic capacitance generated between the wire loop electrode and the metal component becomes small, and thus a decrease in the sensing accuracy due to the parasitic capacitance can be suppressed.

Even if a shield electrode driven at the same potential as that of the wire loop electrode is provided between the wire loop electrode and the metal component as in the related art described in Reference 1 above, a decrease in sensing accuracy due to the parasitic capacitance of the metal component can be suppressed. However, in such a case, the number of components increases due to the addition of the shield electrode and the power consumption for driving the shield electrode increases. In contrast to such a technique of the related art, the non-contact operation sensing device for a vehicle, in which a portion where the interval between the portions of the electric wire is narrowed is provided in a part of the wire loop electrode to suppress a decrease in sensing accuracy due to a metal component, is preferable in terms of suppression of the number of components and the power consumption.

Furthermore, a case will be considered in which the shield electrode is used to suppress a decrease in the sensing accuracy due to the parasitic capacitance of the metal component provided in the portion between the wire loop electrode and the space which is a sensing target and in which the non-contact operation is performed. In this case, the shield electrode is provided at a position closer to the sensing target than the wire loop electrode, so that the location of the wire loop electrode is spaced apart from the sensing target by the installation space of the shield electrode. On the other hand, the change in the capacitance of the wire loop electrode due to the conductor decreases as the distance from the conductor increases. Therefore, in this case, even if a decrease in the sensing accuracy due to the parasitic capacitance of the metal component is suppressed, the sensing accuracy decreases due to the increase in the distance between the sensing target and the wire loop electrode.

In this regard, in the non-contact operation sensing device for a vehicle according to the aspect of this disclosure, the metal component may be provided in a portion between the wire loop electrode and a space which is a target for sensing by a non-contact operation. Also in this case, a decrease in the sensing accuracy due to the parasitic capacitance of the metal component is suppressed without increasing the distance between the sensing target and the wire loop electrode.

In the non-contact operation sensing device for a vehicle according to the aspect of this disclosure, which may also be implemented as a configuration applied to a vehicle, the wire loop electrode may be provided in a rear bumper of the vehicle, and the metal component may be a hitch that is attached for trailer connection to the vehicle body so as to further protrude to a rear side of the vehicle body from a rear bumper through a portion below the rear bumper under a floor of the vehicle body. Incidentally, in such a case, the non-contact operation sensing device for a vehicle can be used as a device for sensing in and out motions of a toe with respect to a vehicle which opens and closes a backdoor in response to the in and out operations in the space below the rear bumper of the vehicle body.

Further, in the non-contact operation sensing device for a vehicle according to the aspect of this disclosure, the capacitance sensor may be configured as follows. That is, the capacitance sensor may include a holder having first and second wire-holding lanes that are each for holding the electric wire, are spaced apart from each other, and extend in parallel to each other. The first and second wire-holding lanes may each have two portions which can draw out the electric wire in addition to both ends of each lane and are provided with the location of the metal component interposed therebetween. In this configuration, one of both ends of the holder in the extending direction of the wire-holding lane may be called a drawing end, and the other one thereof may be called a folding-back end. In this case, the electric wire may be held in the holder in such a manner that both ends of the electric wire are drawn from the first and second holding lanes, respectively, at the drawing end and folded back at the folding-back end so as to shift from the first wire-holding lane to the second wire-holding lane and folded front and rear portions of the electric wire are located in the same wire-holding lane at a portion between the two drawn-out portions in the holder.

In such a case, in the portion of the holder close to the metal component, the folded front and rear portions of the electric wire are held in the same wire-holding lane, so that the interval between the portions of the electric wire becomes narrow. On the other hand, in the portion of the holder distant from the metal component, the folded front and rear portions of the electric wire are held separately in the first and second wire-holding lanes, respectively, so that the interval between the portions of the electric wire becomes wide. Therefore, the capacitance sensor configured as described above has a wire loop electrode in which the interval between the portions of the electric wire is narrower at a portion close to the metal component than at a portion distant from the metal component.

In the holder configured as described above, the electric wire can be assembled so that the folded front and rear portions of the electric wire are held separately in the first and second wire-holding lanes, respectively, even in the portion between two replacement portions. When the electric wire is assembled in such a manner in the holder, the interval between the portions of the electric wire can be made constant in the holder. Therefore, when the electric wire is assembled in the holder as described above, a capacitance sensor also suitable for use in a vehicle that has no metal component capable of causing a decrease in sensing accuracy due to parasitic capacitance and thus does not need to have a locally lowered sensitivity portion in the wire loop electrode can be manufactured using a common component.

Incidentally, the hitch for trailer connection as described above is provided as an optional component in many types of vehicles, and vehicles of the same type may include vehicles with the hitch and vehicles with no hitch. On the other hand, when the wire loop electrode of the capacitance sensor is provided so as to include the portion close to the position where the hitch can be provided, a decrease in the sensing accuracy due to the parasitic capacitance of the hitch should be taken into account, and the capacitance sensor should be designed to be different between vehicles with the hitch and vehicles of the same type with no hitch. However, due to the difference in the optional component, preparation of dedicated capacitance sensors will lead to an increase in the number of capacitance sensor types required to be produced, which may cause a decrease in productivity.

Against this, the capacitance sensor may be configured as follows. That is, a capacitance sensor according to another aspect of this disclosure includes: one electric wire that forms a wire loop electrode; and a holder having first and second wire-holding lanes that are each for holding the electric wire, are spaced apart from each other, and extend in parallel to each other, wherein when one of both ends of the holder in the extending direction of the wire-holding lane is called a drawing end and the other one thereof is called a folding-back end, the electric wire is held in the holder in such a manner that both ends of the electric wire are drawn from the first and second holding lanes, respectively, at the drawing end and are folded back at the folding-back end so as to shift from the first wire-holding lane to the second wire-holding lane, and the holder has a plurality of replacement portions that allow shift between the wire-holding lanes for holding the electric wire.

In the holder of the capacitance sensor configured as described above, the folded front and rear portions of the electric wire are held separately in the first and second wire-holding lanes at portions around the drawing end and the folding-back end. On the other hand, in a portion between two of the replacement portions provided in the holder, selection is possible as to whether the folded front and rear portions of the electric wire are held separately in the first and second wire-holding lanes or are held in the same wire-holding lane. In this case, the interval between the folded front and rear portions of the electric wire is wide in a portion where the wire portions are held separately in the respective wire-holding lanes, and the interval between the folded front and rear portions of the electric wire is narrow in a portion where the wire portions are held in the same wire-holding lane. In the portion where the interval between the portions of the electric wire is narrow, the sensitivity of the wire loop electrode is locally decreased. Therefore, when the electric wire is assembled in the holder so that the interval between the portions of the electric wire positioned near the metal component becomes narrow, a decrease in the sensing accuracy due to the parasitic capacitance of the metal component is suppressed. The way to assemble the electric wire in the holder may be changed so that it is possible to change the presence or absence of the portion where the interval between the portions of the electric wire is locally narrowed or to change the position or the length of the portion. Therefore, it is possible to use common components for plural types of capacitance sensors for use in vehicles having different situations for metal component placement, which causes a decrease in sensing accuracy.

According to the aspects of this disclosure, it is possible to suppress a decrease in sensing accuracy due to the parasitic capacitance of a metal component provided near the wire loop electrode.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. A non-contact operation sensing device for a vehicle with a vehicle body that includes a metal component, the non-contact operation sensing device, comprising:
 a capacitance sensor including a wire loop electrode configured with one loop-shaped electric wire that changes capacitance according to a non-contact operation with respect to the vehicle body, wherein
 the electric wire includes folded back portions arranged in parallel, an interval between the folded back portions of the electric wire is narrower at a portion close to the metal component than at a portion distant from the metal component.

2. The non-contact operation sensing device for a vehicle according to claim 1, wherein
the wire loop electrode is provided in a rear bumper of the vehicle, and
the metal component is a hitch that is attached for trailer connection to the vehicle body so as to further protrude to a rear side of the vehicle body from below the rear bumper under a floor of the vehicle body.

3. The non-contact operation sensing device for a vehicle according to claim 2, wherein
the capacitance sensor includes a holder includes first and second wire-holding lanes that are each for holding the electric wire, that are spaced apart from each other, and that extend in parallel to each other, the holder includes two replacement portions that are provided with the location of the metal component interposed therebetween and allow shift between the wire-holding lanes for holding the electric wire, and
one of both ends of the holder in the extending direction of the wire-holding lane is a drawing end and the other one thereof is a folding-back end, the electric wire is held in the holder in such a manner that both ends of the electric wire are drawn from the first and second holding lanes, respectively, at the drawing end and are folded back at the folding-back end so as to shift from the first wire-holding lane to the second wire-holding lane and folded front and rear portions of the electric wire are located in a same wire-holding lane at a portion between the two replacement portions of the holder.

4. The non-contact operation sensing device for a vehicle according to claim 1, wherein
the capacitance sensor includes a holder including first and second wire-holding lanes that are each for holding the electric wire, that are spaced apart from each other, and that extend in parallel to each other,
the holder includes two replacement portions that are provided with a location of the metal component interposed therebetween and allow shift between the wire-holding lanes for holding the electric wire, and
one of both ends of the holder in the extending direction of the wire-holding lane is a drawing end and the other one thereof is a folding-back end, the electric wire is held in the holder in such a manner that both ends of the electric wire are drawn from the first and second holding lanes, respectively, at the drawing end and are folded back at the folding-back end so as to shift from the first wire-holding lane to the second wire-holding lane and folded front and rear portions of the electric wire are located in a same wire-holding lane at a portion between the two replacement portions of the holder.

5. A non-contact operation sensing device for a vehicle with a vehicle body that includes a metal component, the non-contact operation sensing device comprising:
a capacitance sensor including a wire loop electrode configured with one electric wire, two holders and one connector, wherein
the holders are plates extending in a vehicle width direction in a state assembled to the vehicle body and the holders are provided at intervals in the vehicle width direction with a location of the metal component interposed therebetween,
the holders are provided with two wire-holding lanes extending parallel to each other at intervals to hold the electric wires, respectively, and extending in the vehicle width direction when assembled to the vehicle body,
the electric wire is folded back after passing through a first lane of a first holder and a first lane of a second holder from the connector, to pass through a second lane of the second holder and a second lane of the first holder, and to return to the connector, and
in a portion between the holders, folded front and rear portions of the electric wire are bundled, so that an interval between portions of the electric wire arranged in parallel is narrower at a center portion in the vehicle width direction close to the metal component than at portions on both sides which are spaced apart from the metal component in the vehicle width direction.

6. The non-contact operation sensing device for a vehicle according to claim 5, wherein
the wire loop electrode is provided in a rear bumper of the vehicle, and
the metal component is a hitch that is attached for trailer connection to the vehicle body so as to further protrude to a rear side of the vehicle body from below the rear bumper under a floor of the vehicle body.

* * * * *